United States Patent

Mobin

[11] Patent Number: 5,748,682
[45] Date of Patent: May 5, 1998

[54] OSCILLATOR FREQUENCY OFFSET ERROR ESTIMATOR FOR COMMUNICATIONS SYSTEMS

[75] Inventor: Mohammad Shafiul Mobin, Whitehall, Pa.

[73] Assignee: Lucent Technologies Inc., Murray Hill, N.J.

[21] Appl. No.: 674,929

[22] Filed: Jul. 3, 1996

Related U.S. Application Data

[63] Continuation of Ser. No. 357,802, Dec. 16, 1994, abandoned.

[51] Int. Cl.$^6$ .................................................. H04L 27/06
[52] U.S. Cl. ........................... 375/344; 375/329; 329/304
[58] Field of Search ................................ 375/324–327, 375/344, 329; 329/304, 306–307, 345–346

[56] References Cited

U.S. PATENT DOCUMENTS

| | | | |
|---|---|---|---|
| 3,778,550 | 12/1973 | David et al. | 375/373 |
| 4,712,222 | 12/1987 | Heard et al. | 375/344 |
| 4,835,792 | 5/1989 | Davarian | 375/344 |
| 5,007,068 | 4/1991 | Simon et al. | 375/344 |
| 5,230,011 | 7/1993 | Gielis et al. | 375/344 |
| 5,400,363 | 3/1995 | Waugh et al. | 375/344 |

OTHER PUBLICATIONS

Spring Joint Computer Conference, 1971, "A Unified Algorithm for Elementary Functions," J. S. Walther, Hewlett–Packard Co., Palo Alto, CA, pp. 379–385.

IRE Transactions Electronic Computers, "The Cordic Trigonometric Computing Technique," J. E. Volder, Sep. 1959, pp. 330–334.

IEEE Signal Processing Magazine, "CORDIC–Based VLSI Architectures for Digital Signal Processing.", Yu Hen Hu, Jul. 1992, pp. 16–35.

Phoenix Conference on Computers and Communications, 1991 Conference Proceedings, Mar. 27–30, 1991, Scottsdale, AZ, "Signal Processing Aspects of Motorola's Pan–European Digital Cellular Validation Mobile," David E. Borth and Phillip D. Rasky, pp. 416–423.

*Primary Examiner*—Young T. Tse

[57] ABSTRACT

Briefly, in accordance with one embodiment of the invention, an oscillator frequency offset error estimator at the receiving end of a wireline communications system comprises: a phase comparator adapted to compare two successive signal samples, each signal sample being derived from a baseband signal transmitted via the wireline communications system. The phase comparator is further adapted to have at least one of the two signal samples provided along a signal path through a phase shifter and a time delay. In accordance with another embodiment, a method of comparing signal samples to estimate the oscillator frequency offset error for an oscillator at the receiving end of a wireline communications system comprises the steps of: delaying a signal sample processed by the oscillator at the receiving end of the wireline communications system at least until the next successive signal sample processed by the oscillator is also obtained; adjusting the phase of at least one of the two signal samples; and, after the phase adjusting step, comparing the phase of the two signal samples. The signal samples are derived from a baseband signal transmitted via the wireline communications system.

20 Claims, 8 Drawing Sheets

FB: FREQUENCY BURST

0: COUNTER CLOCKWISE 90° ROTATION

1: CLOCKWISE 90° ROTATION

FIG. 8

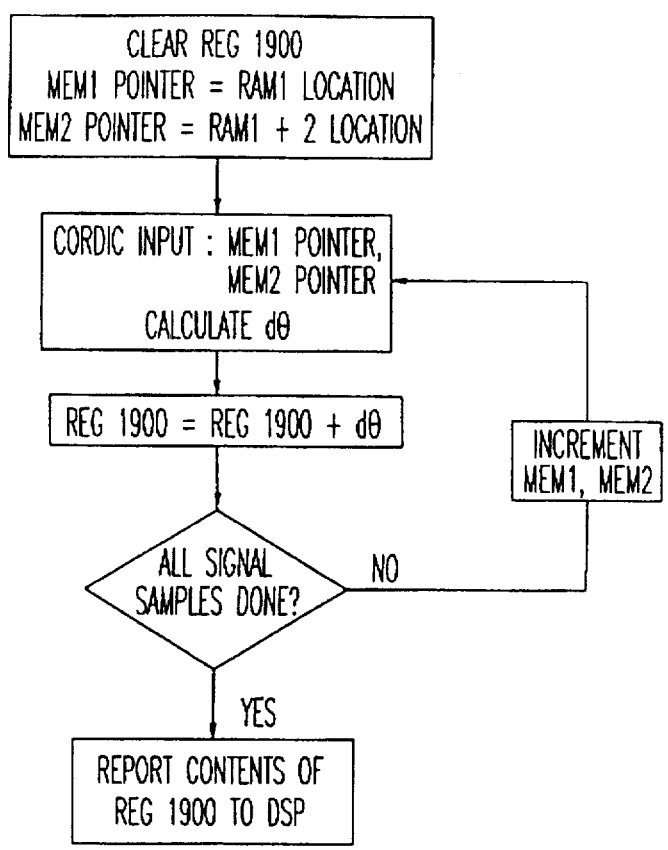

FIG. 10

INITIALLY
$$\begin{cases} n = 1 \\ i = 0 \\ \Delta\theta_{sum}(0) = 0 \\ \mu = \text{SCALING FACTOR (TYPICALLY CLOSE TO ONE)} \end{cases}$$

EACH ITERATION
$$\begin{cases} \Delta\theta = \tan^{-1}\dfrac{\Delta Q}{\Delta I} \\ \Delta\theta_{sum}(n) = \Delta\theta_{sum}(n-1) + \Delta\theta \\ i = i + 1 \\ \Delta\theta_{AV}(n) = \dfrac{\Delta\theta_{sum}(n)}{i} \\ \theta(n) = \theta(n-1) + \mu\Delta\theta_{AV}(n) \end{cases}$$

*FIG. 11*

INITIALLY
$$\begin{cases} i = 0 \\ n = 1 \\ \Delta I(0) = 0 \\ \Delta Q(0) = 0 \end{cases}$$

REPEAT FOR
i=n TO M
$$\begin{cases} \Delta I(n) = \Delta I(n-1) + \Delta I \\ \Delta Q(n) = \Delta Q(n-1) + \Delta Q \\ i = i + 1 \end{cases}$$

WHEN
i=M
$$\begin{cases} \Delta I_{AV} = \dfrac{\Delta I(n)}{i} \\ \Delta Q_{AV} = \dfrac{\Delta Q(n)}{i} \\ \Delta \theta_{AV} = \tan^{-1} \dfrac{\Delta Q_{AV}}{\Delta I_{AV}} \end{cases}$$

OSCILLATOR FREQUENCY OFFSET ERROR ESTIMATOR FOR COMMUNICATIONS SYSTEMS

This is a Continuation of application Ser. No. 08/357,802 filed Dec. 16, 1994, now abandoned.

CROSS-REFERENCE TO RELATED APPLICATIONS

This patent application is being filed concurrently with patent application Ser No. 08/357,802 entitled "Oscillator Frequency Offset Error Estimator for Communications Systems, Such as For Use With GSM" by M. S. Mobin, filed Dec. 16, 1994, patent application Ser. No. 08/356,998, entitled "Coarse Frequency Burst Detector for a Wireless Communications System, Such as For Use With GSM" by M. S. Mobin, filed Dec. 16, 1994, and patent application Ser. No. 08/357,804, entitled "Coarse Frequency Burst Detector for a Wireline Communications System," by M. S. Mobin, filed Dec. 16, 1994, all of the foregoing assigned to the assignee of the present invention and herein incorporated by reference.

TECHNICAL FIELD

The present invention relates to communications and, more particularly, to wireline communications systems.

BACKGROUND OF THE INVENTION

A number of well-known communication signaling techniques are used throughout the world, one example being gaussian minimum phase shift keying (GMSK). One advantage of this form of phase modulation is to permit a constant amplitude modulator to be employed. Thus, non-linear carrier frequency power amplifiers may be employed in a communications system utilizing this phase modulation technique.

One common problem in a communications system that employs GMSK is frequency detection. One reason is because typically oscillators employed in either the transmitter or receiver are non-ideal due to cost considerations, circuit complexity considerations and for other reasons. Thus, it may be difficult in such communication systems to "lock" onto the proper carrier frequency necessary for the communications system to operate satisfactorily. One approach that may be employed includes transmitting a frequency burst of a known signal that may be employed at the receiving end of the communications system for frequency correction. In a digital system, one such frequency correction burst may comprise a successive number of digital samples, such as either a successive number of "ones" or a successive number of "zeros".

Once the receiver senses or detects the frequency burst, it may employ the frequency burst to calibrate itself for an oscillator frequency offset error that may be present. Once the receiver has an estimate of the oscillator frequency offset error, it may use the estimate to perform automatic frequency correction (AFC). However, conventional AFC loops suffer from a number of disadvantages. Analog AFC loops are usually implemented with a phase locked loop or with a phase locked loop with digital scalers, thus, requiring a significant amount of hardware complexity in addition to other circuitry for the receiver. Alternatively, such AFC loops may be implemented digitally, such as with a conventional digital signal processor (DSP). Disadvantages of a digital implementation include an angle or phase ambiguity problem related to the computation of the arctangent, which is periodic with a period of 180°, and the consumption of digital signal processor (DSP) computational resources during peak signal loading periods of receiver operation in an environment with limited computational resources. A need therefore exists for a technique for estimating the oscillator frequency offset error at the receiving end of a wireline communications system that either consumes less power, is less computationally intensive, or that avoids the phase ambiguity problem typically encountered in digital AFC loops.

SUMMARY OF THE INVENTION

Briefly, in accordance with one embodiment of the invention, an oscillator frequency offset error estimator at the receiving end of a wireline communications system comprises: a phase comparator adapted to compare two successive signal samples, each signal sample being derived from a baseband signal transmitted via the wireline communications system. The phase comparator is further adapted to have at least one of the two signal samples provided along a signal path through a phase shifter and a time delay. In accordance with another embodiment, a method of comparing signal samples to estimate the oscillator frequency offset error for an oscillator at the receiving end of a wireline communications system comprises the steps of: delaying a signal sample processed by the oscillator at the receiving end of the wireline communications system at least until the next successive signal sample processed by the oscillator is also obtained; adjusting the phase of at least one of the two signal samples; and, after the phase adjusting step, comparing the phase of the two signal samples. The signal samples are derived from a baseband signal transmitted via the wireline communications system.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

FIG. 7 is a schematic diagram and FIGS. 8 and 9 are flowcharts illustrating particular alternative embodiments of an oscillator frequency offset error estimator for a wireline communications system in accordance with the invention.

FIGS. 10 and 11 are tables illustrating alternative techniques for iteratively integrating and averaging that may be employed by an embodiment of an oscillator frequency offset error estimator for a wireline communications system in accordance with the invention.

DETAILED DESCRIPTION

Figure 2:
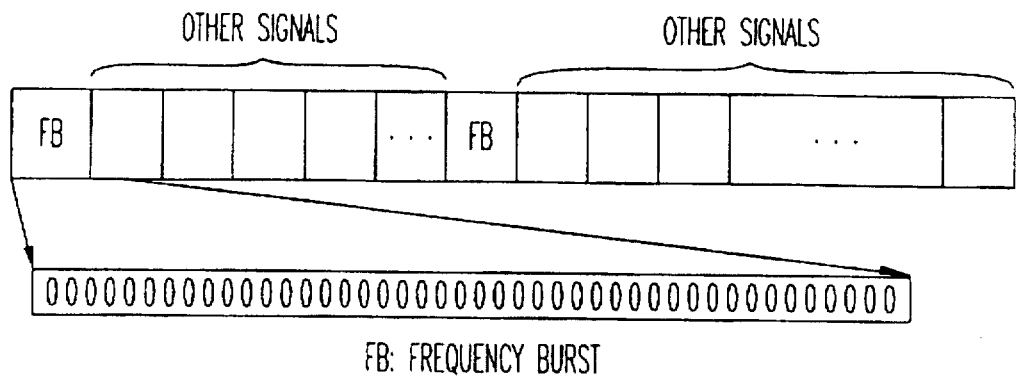
FIG. 2 is a schematic diagram of an embodiment of a frequency burst, such as may be employed by a wireline communications system. The embodiment of a frequency burst illustrated may be detected for use by an oscillator frequency offset error estimator for a wireline communications system in accordance with the invention to estimate the oscillator frequency offset error.

As previously described, a frequency burst may be employed over a wireline communications system for frequency detection and correction. As shown in FIG. 2, the embodiment of a frequency burst illustrated comprises a frequency correction data burst or frequency burst in the form of a predetermined number of successive "zero" signals. The invention is, of course, not restricted in scope to a frequency burst having this particular signal structure. As one example, alternatively a frequency burst of all "ones" may be employed. However, this embodiment produces a substantially constant frequency shift of the carrier frequency that may be employed at the receiving end of a wireline communications system for frequency correction, such as may be useful, for example, due to an oscillator frequency offset error that may have been introduced, for example, by the oscillator employed as part of the signal processing performed at the receiving end. In this context, the term "oscillator frequency offset error" refers to a situation in which the frequency of oscillation of the oscillator may be offset from a substantially predetermined, desired frequency by an unspecified amount or offset error. This oscillator frequency offset error may likewise introduce a phase offset error when the oscillator is employed to perform signal processing. The terms "phase offset error" and "frequency offset error" are therefore employed interchangeable in this context because information regarding one may be employed to derive the other based on well-known fundamental relationships between signal phase and signal frequency. Likewise, in this context, references to the "oscillator frequency offset error" or the "estimate of the offset error" are used interchangeable with references to the "phase offset error" or the "estimate of the phase offset error."

One useful form of signal modulation in the baseband known as gaussian minimum phase shift keying (GMSK). GMSK is described in more detail in *Digital Phase Modulation*, by J. B. Anderson, T. Aulin, and C. E. Sundberg, 1986, available from Plenum, although the invention is not restricted in scope to GMSK or MSK. For example, alternatively an oscillator frequency offset error estimator for a wireline communications system in accordance with the invention may be used in conjunction with a variety of modulation schemes, such as minimum phase shift keying (MSK) or differential quadrature phase shift keying (DQPSK).

In a GSM GMSK specified transmitter, the input bit or binary digital signal stream is differentially encoded and applied to a filter with a gaussian impulse frequency response and then FM modulated. The gaussian filtered waveform is passed to an FM modulator that produces a positive or negative $\pi/2$ it radians or 90° phase shift for each NRZ (non-return to zero) signal being transmitted. One advantage of this form of signal modulation is to permit a constant amplitude modulator to be employed and for "spectral efficiency". Thus, nonlinear carrier frequency power amplifiers may be employed at both the transmitting and receiving end of the wireline communications system.

Figure 3:
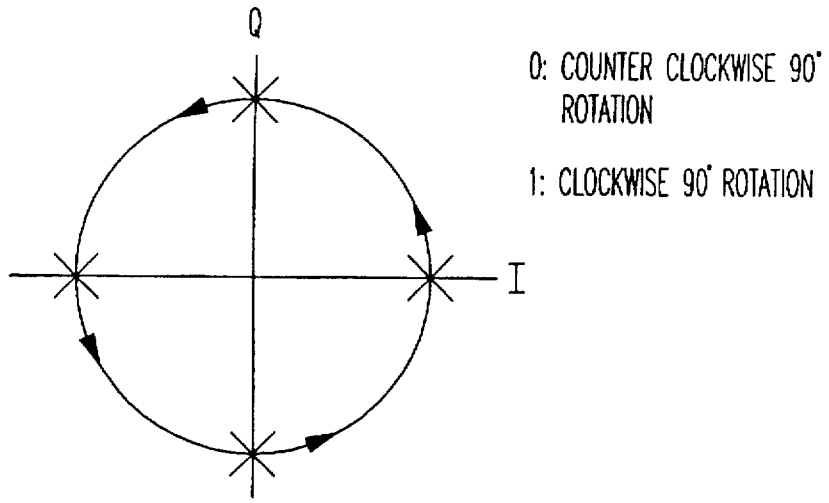
FIG. 3 is a diagram of an "idealized" signal constellation in the Inphase-Quadrature (I-Q) plane for a minimum phase shift keyed (MSK) signal. Such a signal constellation may be representative of the signaling scheme resulting from the use of gaussian minimum phase shift keying (GMSK).

FIG. 3 illustrates an idealized signal constellation in the Inphase-Quadrature (I-Q) plane of a frequency burst of "zero" signals that have been encoded in accordance with GSM GMSK specified modulation in the baseband for signal transmission via a wireline communications system, such as over a wireline cable. In this context, a wireline communications system refers to a communications system having a transmitting end and a receiving end in which signals are transmitted or communicated from the transmitting end to the receiving end via a wireline signal path. Examples of a wireline signal path include a signal path comprising coaxial cables, twisted pair copper wires, optical fibers (and/or any combinations thereof). At the receiving end of the wireline signal path, after downconversion, each differentially encoded bit value will produce a phase shift in the I-Q plane of $+\pi/2$ radians or 90°, as illustrated in FIG. 3. This corresponds to a counter-clockwise rotation in the I-Q plane for a stream of binary digital signal "zeros" being transmitted. Likewise, the transmission of a frequency burst of all "ones" corresponds to clockwise rotation. Alternatively, this may be viewed as equivalent to shifting the carrier frequency for the signal transmitted via the wireline signal path by a value of $+B/4$ when a frequency burst of all "zeros" is transmitted and $-B/4$ when a frequency burst of all "ones" is transmitted, where B is the bit rate of the transmitted binary digital signal stream. At the receiving end, after downconversion, the transmitted signal is obtained by "derotating" the signal in the baseband and passing it through a minimum least squares error (MLSE) equalizer. More particularly, regarding "derotation," a clockwise rotation of 90° may be applied to each encoded digital signal transmitted via the wireline signal path, such as by signal multiplication of the baseband signal in the time domain by $$e^{\frac{-j\pi}{2}k},$$

where k=0, 1, 2, 3. Of course, the invention is not restricted in scope to a signaling scheme employing a particular direction of rotation or derotation. The direction will depend, at least in part, on the particular signaling scheme.

Figure 1:
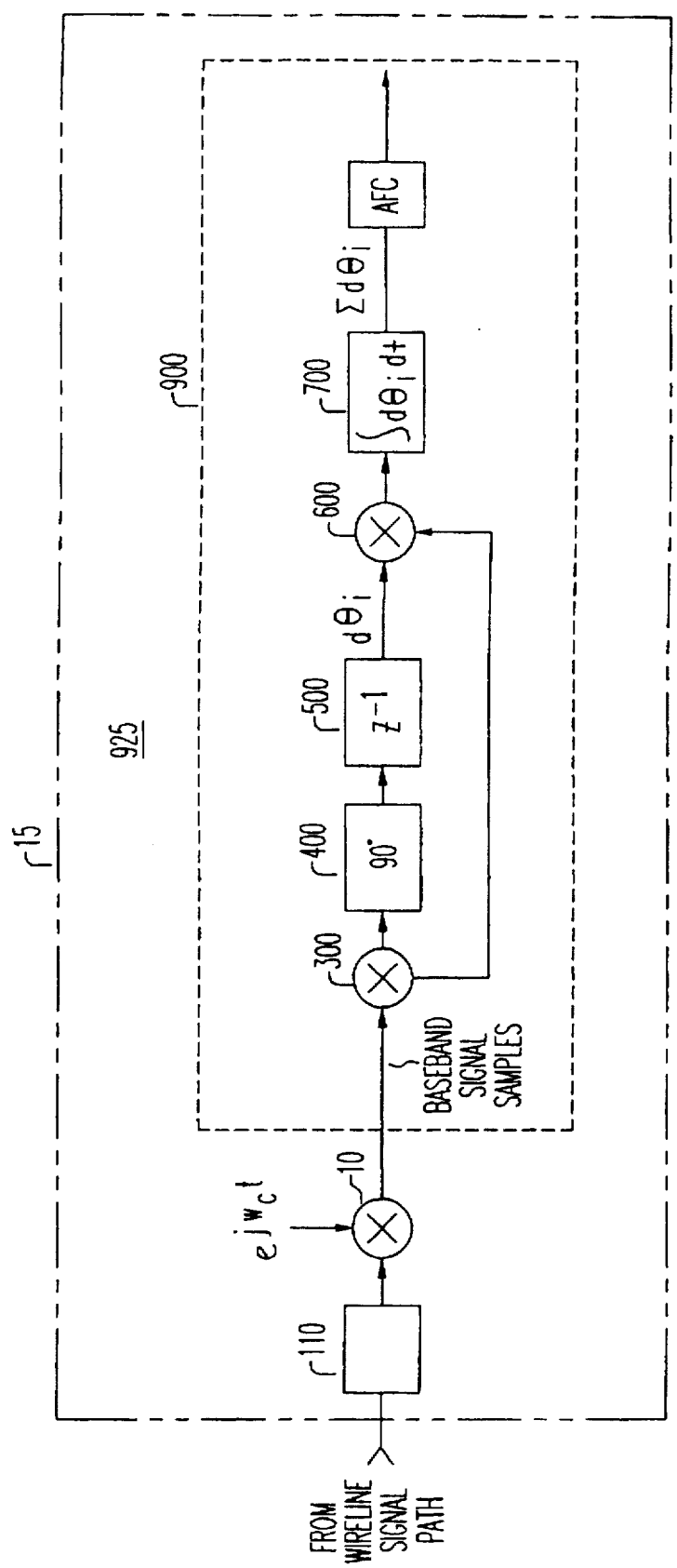
FIG. 1 is a schematic diagram of an embodiment of an oscillator frequency offset error estimator for a wireline communications system in accordance with the invention.

Over a wireline communications system, a physical channel may be monitored for a frequency burst signal. Likewise, once the frequency burst is detected, it may be employed by the receiver to calibrate or estimate the oscillator frequency offset error. One embodiment of an oscillator frequency offset error estimator for a wireline communications system in accordance with the invention is illustrated in FIG. 1. As illustrated by embodiment 925 shown in FIG. 1, a carrier signal including an encoded baseband signal transmitted via a wireline signal path by the transmitter may be received by a receiver 15. As illustrated in FIG. 1, the signal may be downconverted, i.e., the carrier may be removed. This downconversion is illustrated schematically in FIG. 1 by node 10 denoting signal multiplication in the time domain. (Block 110 in FIG. 1 illustrates a conventional power amplifier.) This may be performed, for example, in the digital signal domain by a conversion signal processor (CSP) or a digital signal processor (DSP). It will, of course, be appreciated that any one of a number of specific techniques for removing the carrier frequency to downconvert the transmitted signal may be performed and the invention is not restricted in scope to any particular approach, technique, circuitry, or signal processor.

Embodiment 900 of an oscillator frequency offset error estimator for a wireline communications system in accordance with the invention performs signal processing of the baseband signal after it has been downconverted. Of course, other or additional signal processing may be performed on or applied to the baseband signal before or after oscillator frequency offset error estimation is performed in alternative embodiments. For convenience, the baseband signal may be digitized to produce baseband signal samples. This analog-to-digital (A/D) conversion may be performed, for example, by a baseband CODEC, which digitizes the baseband analog signal. An example of a downconverter and CODEC to perform such A/D conversion includes the W2020 GSM Transceiver and CSP1088 GSM Conversion Signal Processor, both available from AT&T Corp., although the invention is not restricted in scope to the use of a baseband CODEC to perform the A/D conversion or to these particular devices. Furthermore, the invention is not limited in scope to an embodiment in which A/D conversion is performed so that binary digital signal processing may be employed. Likewise, the invention is not restricted in scope to performing A/D conversion at this particular point in the signal path. For example, A/D conversion may be performed earlier in the signal path, such as before removal of the carrier frequency, or later in the signal path, depending on the particular embodiment.

Estimation of the oscillator frequency offset error by an embodiment of an oscillator frequency offset error estimator for a wireline communications system in accordance with the invention is now described. For this particular embodiment, oscillator frequency offset error estimation occurs before signal sample derotation and oscillator frequency offset error correction occurs in a later stage, as explained in more detail hereinafter. In this particular embodiment, after A/D conversion and downconversion, baseband signal samples derived from the baseband signal transmitted via the wireline signal path are fed forward from node 300 to node 600. Along a parallel signal path, the baseband signal samples are successively processed, in this particular embodiment by phase modifier or shifter 400 and time delay 500. The signal samples along both paths are then processed by phase comparator 600 and integrator 700. In alternative embodiments the baseband signal samples may be processed in a different sequence, as will become clear based upon the following discussion.

During operation, receiver 15 may obtain a first baseband signal sample of the frequency burst after transmission of the signal over the wireline. This may constitute, for example, a "zero" or a "one," depending upon the frequency burst employed. Assuming a zero signal has been transmitted, such as for the embodiment of a frequency burst illustrated in FIG. 2, this zero signal is encoded in the baseband as a "rotation" of +90° or ½ radians, as previously discussed. As illustrated in FIG. 1, at the receiver this baseband signal sample may now be phase adjusted, indicated by block 400. In this particular embodiment, the phase adjustment comprises a counter-clockwise rotation or phase shift of 90° or ½ radians. As described in more detail hereinafter, the phase adjustment may be performed, for example, by a CORDIC processor, although the invention is not limited in scope in this respect. Next, as illustrated in FIG. 1 by block 500, the phase adjusted baseband signal sample may be delayed in time at least until the next baseband signal sample is obtained. The time delay may be implemented a variety of ways, such as, for example, with a conventional flip-flop, latch, register, or random access memory (RAM). Likewise, it will, of course, be appreciated that the phase adjustment and time delay may be applied to the baseband signal samples in a variety of ways, e.g., the signal samples may be phase adjusted before or after the time delay.

As illustrated in FIG. 1, the next successive baseband signal sample after the signal sample to be phase adjusted and time delayed is obtained through the non-delay path for comparison with the signal sample obtained through the delay path. In this particular embodiment, these two successive baseband signal samples may now be employed to provide an estimate of the oscillator frequency offset error per symbol. Alternatively, as described in more detail hereinafter, other successive baseband signal samples may be compared in phase before obtaining an estimate.

As illustrated in FIG. 1 and as previously described, at node 600, the non-delayed baseband signal sample is compared in phase with the delayed baseband signal sample by a phase comparator, after the delayed baseband signal sample has been phase shifted by 90° in this particular embodiment. The advantages of performing a phase comparison are described in connection with FIG. 4 in more detail hereinafter. It will, of course, now be appreciated that the phase adjustment and time delay is relative between the two successive signal samples. Thus, for example, the non-delayed baseband signal sample may alternatively be phase shifted by −90° relative to the delayed signal sample. Likewise, both signal samples may ultimately be time delayed during processing; however, for two successive discrete signal samples to be simultaneously processed one signal sample is effectively delayed in time relative to the other.

Figure 12:
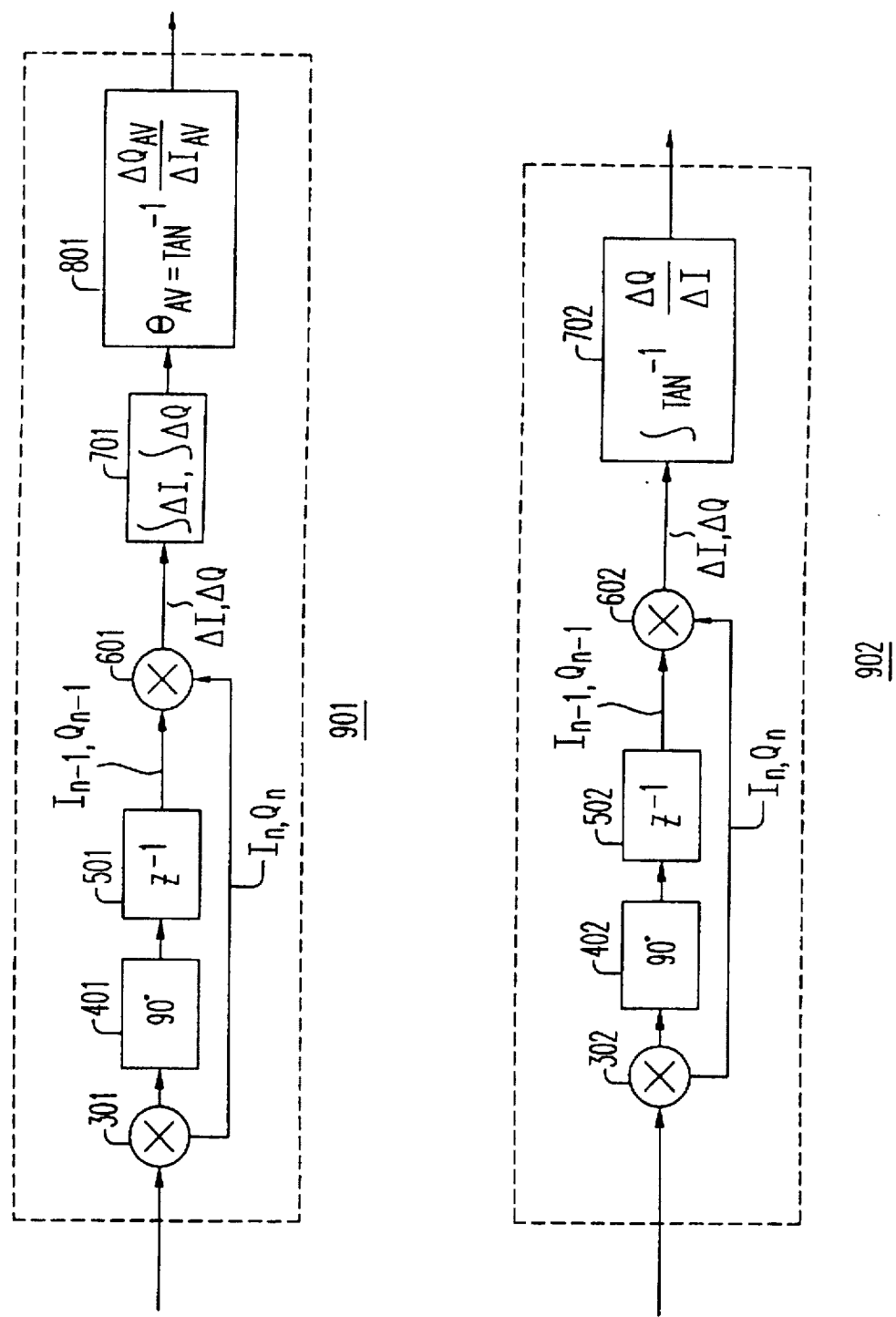
FIG. 12 is a schematic diagram of two more alternative embodiments of an oscillator frequency offset error estimator for a wireline communications system in accordance with the invention.

In one embodiment, successive estimates of the oscillator frequency offset error may be obtained by comparing successive baseband signal samples in phase, as previously described. Each estimate of the oscillator frequency offset error may then be provided to an integrator, such as integrator 700 in FIG. 1, so that successive estimates of the oscillator frequency offset error associated with successive comparisons of baseband signal samples may be integrated or accumulated, such as illustrated by embodiment 902 in FIG. 12, for example. However, FIG. 12 illustrates two alternative approachs to performing the integration or accumulation. In embodiment 902 the differential components of the signal samples obtained based on one comparison in phase are employed to obtain an estimate of the oscillator frequency offset error. These separate estimates of the oscillator frequency offset error are then accumulated or integrated over successive signal samples, such as performed by integrator 702 of embodiment 902. As shown in FIG. 12, this embodiment further includes nodes 302 and 602, phase shifter 402 and delay 502. Likewise, FIG. 10 is a table illustrating one approach for implementing this integration technique. Alternatively, as illustrated by embodiment 901, estimates of the differential signal sample components, in this particular embodiment inphase and quadrature components, denoted $\Delta I$ and $\Delta Q$ in FIG. 12, are separately accumulated, such as by integrator 701, and separately averaged over a range of signal samples. Averages of the differential inphase and quadrature components are then employed to obtain an estimate of the oscillator frequency offset error. This embodiment further includes nodes 301 and 601, phase shifter 401 and delay 501. Likewise, FIG. 11 is a table illustrating the approach for implementing this integration technique. Thus, depending on the particular embodiment, the output signal provided by an oscillator frequency offset error estimator in accordance with the invention may be an estimate of the oscillator frequency offset error or an estimate of the accumulated oscillator frequency offset error for baseband signal samples obtained at the receiving end of the wireline communications system. It is noted in this context that the terms dθ, Δθ, ΔQ and ΔI are used to denote phase offset or signal sample component offset, as appropriate.

The output signal produced may be employed in a wireline communications system in a variety of ways. For example, an estimate of the accumulated oscillator frequency offset error may be employed to derive an estimate of the oscillator frequency offset error to phase compensate each baseband signal sample, such as in a coarse frequency burst detector (CFBD) for a wireline communications system as described in concurrently filed patent application Ser. No. 08/557,804, although the present invention is not limited in scope in this respect. For example, the estimate of the accumulated oscillator frequency offset error produced by embodiment 902 illustrated in FIG. 12 may be divided by the number of signal samples minus one to estimate the oscillator frequency offset error.

As previously indicated, any one of a number of techniques to perform the integration and offset error estimation may be employed. For example, it may be desirable to iteratively integrate and average so that no single offset error estimate dominates the calculations. As previously indicated, a technique for accomplishing this by successively accumulating and averaging estimates of the oscillator frequency offset error is illustrated in FIG. 10, although the invention is, of course, not restricted in scope to this approach. Alternatively, FIG. 11 illustrates a technique in which the components of the signal samples, in the particular approach illustrated the inphase and quadrature components, are separately estimated, accumulated and averaged over a predetermined number of samples. Then the average value of the separate components obtained is employed to obtain an estimate of the oscillator frequency offset error. Of course, an oscillator frequency offset error estimator in accordance with the invention is not limited in scope to a particular technique for integrating and averaging to obtain an estimate of the oscillator frequency offset error. Likewise, the estimate of the oscillator frequency offset error, once obtained, may be employed in an automatic frequency correction (AFC) loop, such as for a receiver.

Figure 4:
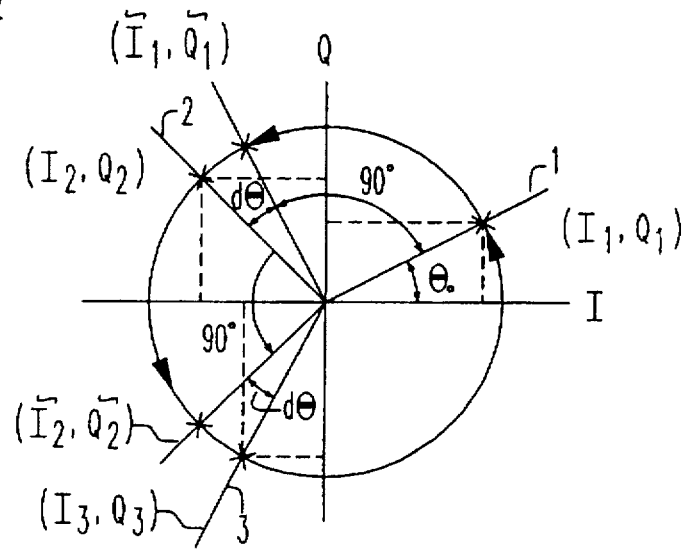
FIG. 4 and FIG. 6 are diagrams of signal samples in the Inphase-Quadrature (I-Q) plane to illustrate aspects of the operation of alternative embodiments of an oscillator frequency offset error estimator for a wireline communications system in accordance with the invention.

The operation of the embodiment of an oscillator frequency offset error estimator for a wireline communications system in accordance with the invention shown in FIG. 1 is illustrated in part by the diagram shown in FIG. 4 of a signal constellation in the I-Q plane. As illustrated, a first baseband signal sample, denoted $(I_1, Q_1)$ in rectangular coordinates, is obtained. As illustrated, an initial offset error, $\theta_o$, may be imparted by the oscillator used to processing the signal sample or from other processing conditions or errors, such as due to the delay between the transmitter and receiver or due to an offset associated with the selection of a particular "sampling instant." Assuming in this example the embodiment of a frequency burst illustrated in FIG. 2, the next signal sample should be a "zero" signal, corresponding in GMSK to a counter clockwise rotation of 90° or π/2 radians for this particular embodiment. However, because the oscillator used to process the signal sample may impart a phase offset due to oscillator frequency offset error, the resulting signal sample may be $(I_2, Q_2)$, denoted in rectangular coordinates, oriented (dθ plus 90°) with respect to $(I_1, Q_1)$ However, an oscillator frequency offset error estimator in accordance with the present invention, such as the embodiment illustrated in FIG. 1, adjusts the phase of signal sample $(I_1, Q_1)$ by 90° or π/2 radians and delays the signal sample so that after phase adjustment, this produces the signal sample denoted $(\tilde{I}_1, \tilde{Q}_1)$ in rectangular coordinates. Thus, signal samples $(\tilde{I}_1, \tilde{Q}_1)$ and $(I_2, Q_2)$ may now be compared in phase to obtain dθ as an estimate of the oscillator frequency offset error.

Likewise, the next signal sample processed by the oscillator may result in $(I_3, Q_3)$. As illustrated, $(I_3, Q_3)$ has an accumulated oscillator frequency offset error of the initial error, $\theta_o$, plus 2 dθ, relative to the I axis. This occurs because the frequency offset error of the oscillator, i.e., an oscillator frequency offset error, introduces an additional phase error for each signal sample processed, as previously described. The second signal sample, denoted $(I_2, Q_2)$, may be phase adjusted and time delayed to produce $(\tilde{I}_2, \tilde{Q}_2)$. Therefore, the estimate of the oscillator frequency offset error provided by embodiment 925, for example, based on a phase comparison of $(I_3, Q_3)$ and $(\tilde{I}_2, \tilde{Q}_2)$ is again dθ. Likewise, the accumulated oscillator frequency offset error may therefore be estimated as 2 dθ. Thus, an average, for example, may be used to estimate the oscillator frequency offset error as dθ in this particular embodiment.

Figure 5:
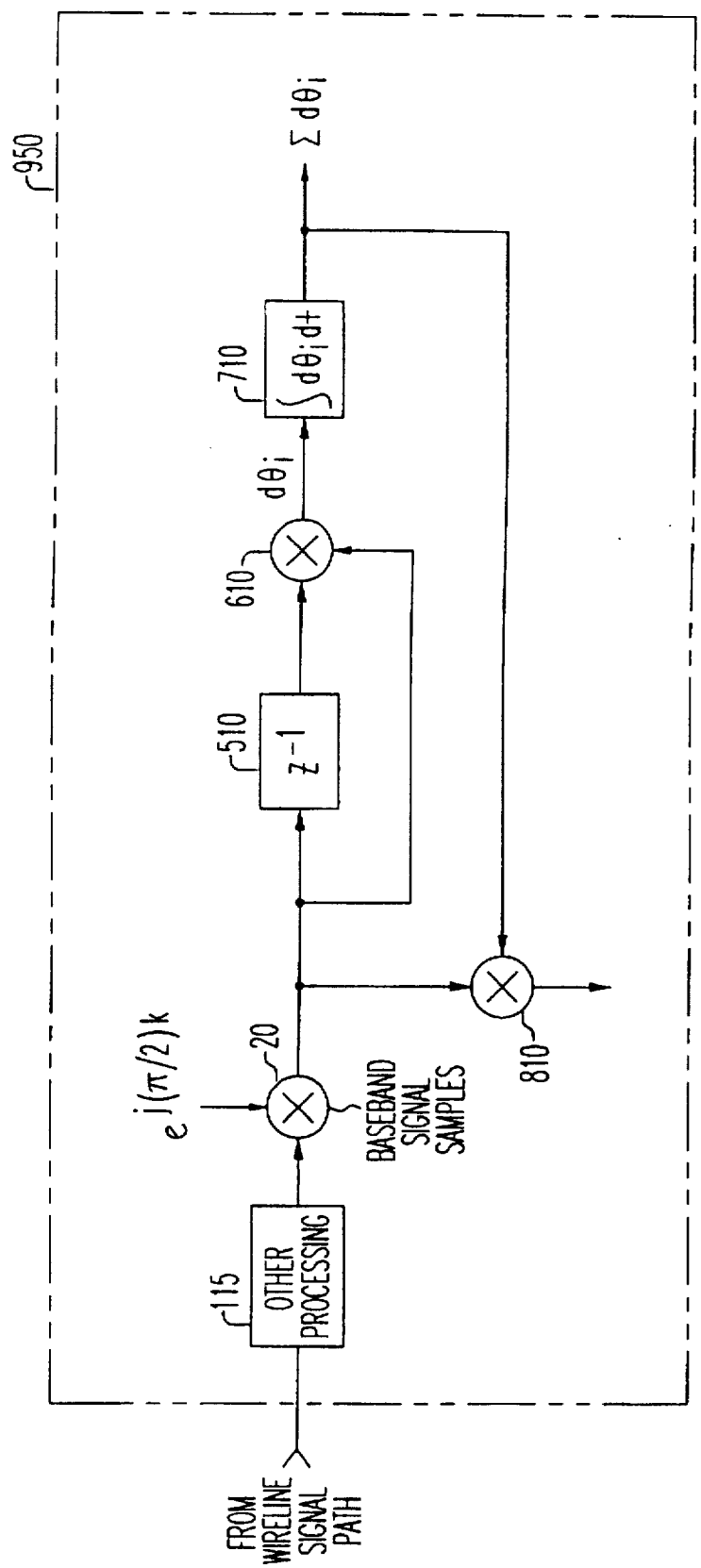
FIG. 5 is a schematic diagram of an alternative embodiment of an oscillator frequency offset error estimator for a wireline communications system in accordance with the invention. For this particular embodiment, accumulated oscillator frequency offset error estimation and correction may be performed in real-time.

FIG. 5 illustrates an alternative embodiment of an oscillator frequency offset error estimator for a wireline communications system in accordance with the invention. Again, digital signal samples are successively processed in this particular embodiment. However, there are differences between the processing performed in the embodiment illustrated in FIG. 5 and the processing performed by the embodiment illustrated in FIG. 1. In this particular embodiment, in comparison with the embodiment illustrated in FIG. 1, frequency offset error estimation occurs after signal sample derotation and frequency offset error correction occurs in real-time. In FIG. 5, as illustrated in FIG. 1, a transmitted signal is received over the wireline signal path, and that signal is downconverted to provide a baseband signal. Although not explicitly shown, the embodiment illustrated in FIG. 5 may also perform the removal of the carrier frequency or other processing, such as at block 115. As illustrated, the baseband signal is then provided to embodiment 950 of an oscillator frequency offset error estimator for a wireline communications system in accordance with the invention. In this particular embodiment, in contrast with the embodiment illustrated in FIG. 1, the baseband signal is "derotated," such as described, for example, in concurrently filed patent application Ser. No. 08/357,804. It is not essential to an oscillator frequency offset error estimator in accordance with the invention that derotation be performed at this point in the signal processing and, as illustrated in FIG. 1, for example, derotation may be performed later, such as after estimation of the oscillator frequency offset error has taken place. However, in this particular embodiment, derotation is conveniently performed in advance of estimation. This is illustrated in FIG. 5 by signal multiplication of the baseband signal in the time domain by $$e^{-\frac{j\pi}{2}k},$$

where k=0, 1, 2, 3, . . . , such as described in concurrently filed patent application Ser. No. 08/357,804. As previously described, typically the baseband signal is digitized by A/D conversion and derotation is applied to discrete baseband signal samples. As illustrated in FIG. 5, for this embodiment, derotated baseband signal samples (or decoded signal samples) are then fed forward to node 610. In parallel with that signed path, derotated baseband signal samples are delayed in time, illustrated by time delay 510 in FIG. 5, and a time delayed derotated baseband signal sample is compared in phase with the next successive derotated baseband signal sample. Thus, at node 610, a phase comparison may be made between two successive derotated baseband signal samples to provide an estimate of the oscillator frequency offset error. Thus, in this particular embodiment, derotation is performed in advance of the oscillator frequency offset error estimation; however, due to the symmetrical nature of the processing, the derotation is "transparent" to the phase comparison at node 610. This same property likewise applies to alternative embodiments including other signal processing that may be applied to the baseband signal samples in advance of phase comparison.

Figure 6:
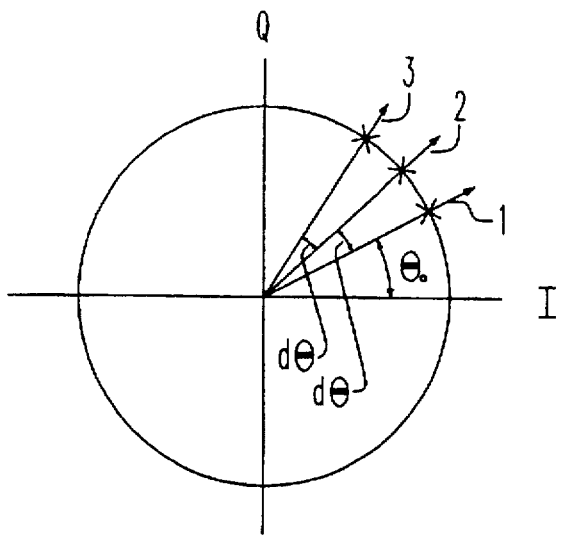

The operation of this embodiment of an oscillator frequency offset error estimator for a wireline communications system in accordance with the invention is illustrated by the diagram shown in FIG. 6. The signal samples denoted by reference numerals 1, 2 and 3 correspond to those signal samples illustrated in FIG. 4, except that in FIG. 6 the signal samples have been decoded by derotation, as may be performed at node 20 of the embodiment illustrated in FIG. 5. Thus, at node 610, a phase comparison is performed between two successive derotated baseband signal samples. For example, the derotated baseband signal sample designated by reference numeral 2 in FIG. 6 may be compared with derotated baseband signal sample designated by reference numeral 1 after the signal sample denoted by reference 1 has been delayed in time. In this embodiment, the result of the phase comparison is an estimate of the oscillator frequency offset error, dθ. Likewise, in this example, the next successive derotated baseband signal sample, denoted 3 in FIG. 6, may be compared in phase with the signal sample denoted 2, after being time delayed. Again, the result of the phase comparison is an estimate of the oscillator frequency offset error, dθ.

Likewise, as illustrated in FIG. 5, successive estimates of the oscillator frequency offset error may be integrated or accumulated by integrator 710 to provide an estimate of the accumulated oscillator frequency offset error. As illustrated in FIG. 5, this estimate of the accumulated oscillator frequency offset error may then be applied to the decoded or derotated baseband signal sample at node 810 in order to adjust or compensate the signal sample for the accumulated oscillator frequency offset error. One advantage of this particular approach is that the signal sample is adjusted for the oscillator frequency offset error in real-time. In contrast, for embodiment 902 illustrated in FIG. 12, for example, the accumulated oscillator frequency offset error is first computed and then used to obtain an estimate of the oscillator frequency offset error, which may then be provided to a later digital Automatic Frequency Correction (AFC) signal processing block or unit to adjust or compensate the baseband signal samples for the oscillator frequency offset error, such as while also performing derotation to decode the signal samples. Likewise, the embodiment illustrated in FIG. 5 may avoid a division, such as described with the respect to the embodiment illustrated in FIG. 1, to derive the oscillator frequency offset error using an integration or accumulation technique. In some environments, avoiding division may be desirable, such as where a conventional digital signal processor is employed.

An oscillator frequency offset error estimator in accordance with the invention, such as illustrated, for example, by the embodiments in FIG. 1 and FIG. 5, has a number of advantages over conventional approachs, such as exhaustive matched filtering. One advantage is that the continual feed forward correction of successive signal samples limits the differential phase comparison to a relatively small range. Therefore, estimation of the oscillator frequency offset error is more accurate than conventional approachs due to greater computational accuracy available for smaller angles, such as when employing the arctangent. Likewise, employing this continual feed forward comparison to limit the differential phase to a relatively small range also has an advantage in that it avoids the phase or angle ambiguity problem that may be encountered in conventional digital signal processing approachs. More specifically, in a conventional approach, processing the accumulated offset error may involve computing the arctangent of the rectangular coordinates of the signal sample including the accumulated offset error. However, as the oscillator frequency offset error is accumulated sample after sample, such as illustrated in FIG. 4, this approach may create an ambiguity regarding the amount of offset error that has accumulated because the arctangent is periodic with a period of 180°. Thus, in some situations, distinguishing between accumulated offset error below and above 180° may prove troublesome. In conventional approachs, it may therefore be necessary to retain additional signal information, such as, for example, the sign of the inphase and quadrature components, to avoid an angle ambiguity of this type. This, however, may prove cumbersome and difficult in some circumstances. See, for example, "Signal Processing Aspects of Motorola's Pan European Digital Cellular Validation Module," by David Borth and Phillip Raskey, published in the 1991 Conference Proceedings of the Phoenix Conference on Computers and Communications, held in Scarsdale, Ariz. on Mar. 27-30, 1991, herein incorporated by reference. Instead, an oscillator frequency offset error estimator in accordance with the invention avoids this problem. The continual feed forward correction limits the differential phase to a relatively small range so that offset errors below π radians or 180° are encountered to thereby remove the potential ambiguity.

Figure 7:
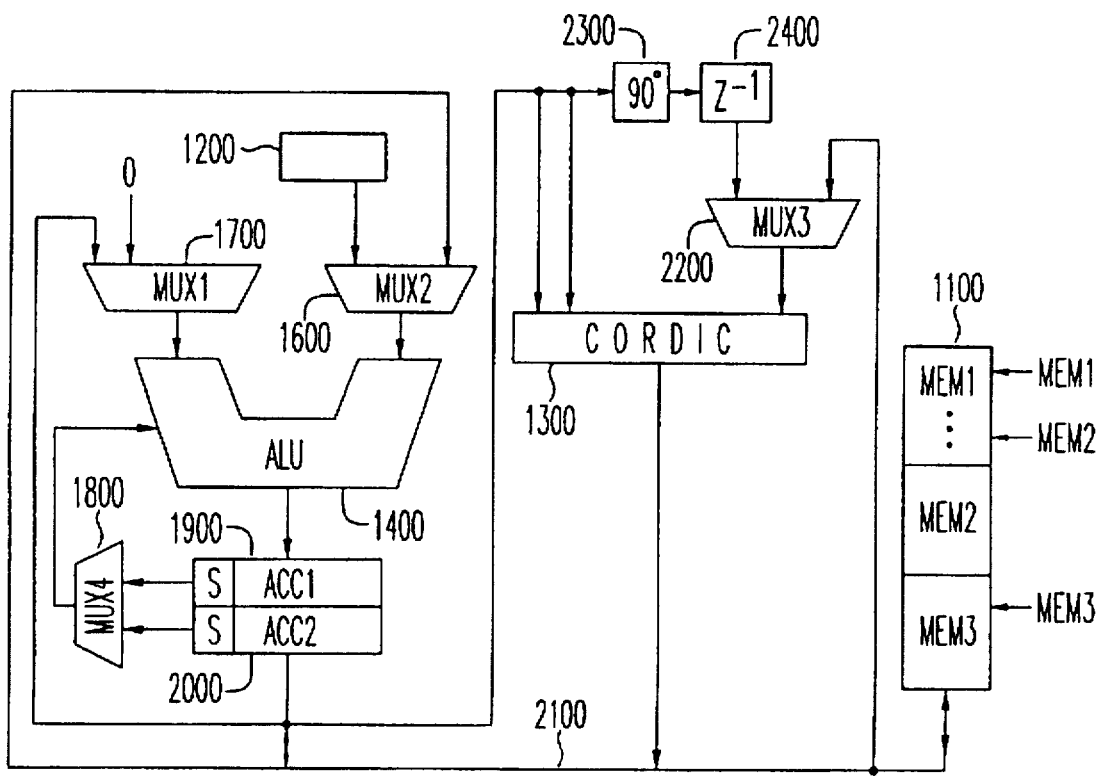

A vector processor or co-processor 1000 for implementing an embodiment of an oscillator frequency offset error estimator for a wireline communications system in accordance with the invention is illustrated in FIG. 7. Such a vector co-processor may be employed to implement an embodiment of an oscillator frequency offset error estimator in accordance with the invention using digital signal processing; however, as will now be appreciated by those of ordinary skill in the art, alternative vector co-processors for implementing alternative embodiments of an oscillator frequency offset error estimator for a wireline communications system in accordance with the invention are possible and the invention is not restricted in scope to this particular vector co-processor. Furthermore, alternative embodiments may process signals other than binary digital signals to perform oscillator frequency offset error estimation.

Vector co-processor 1000 illustrated in FIG. 7 includes a memory cache or RAM 1100, a CORDIC processor 1300, and an arithmetic logic unit (ALU) 1400. CORDIC processors are well-known in the art, such as described in, for example, "The CORDIC Trigonometric Computing Technique," by J. E. Volde, appearing in IRE Transactions on Electronic Computers, September, 1959, and in "CORDIC Based VLSI Architectures for Digital Signal Processing," by Yu Hen Hu, appearing in IEEE Signal Processing Magazine, July, 1992, both of which are herein incorporated by reference. As illustrated in FIG. 7, memory cache 1100, CORDIC processor 1300 and ALU 1400 are coupled by signal bus 2100 capable of transmitting, for example, 16-bit digital signals, although the scope of the invention is not limited in this respect. Likewise, for this particular implementation only, it is assumed that it requires two successive memory locations to store a complex signal sample in RAM 1100. Vector co-processor 1000 further includes register 1200, multiplexers (MUXs) 1600 and 1700, registers 1900 and 2000, and multiplexer (MUX) 1800 coupled as illustrated in FIG. 7. A similar vector processor coprocessor is described in concurrently filed patent application Ser. No. 08/557,804, although the vector co-processor illustrated in FIG. 7 further includes a 90° phase shifter 2300, a time delay 2400, and a MUX 2200.

The operation of vector co-processor 1000 to implement an embodiment of an oscillator frequency offset error estimator for a wireline communications system in accordance with the invention is now explained and illustrated by the flowchart shown in FIG. 8. Of course, FIG. 8 illustrates only one possible implementation of an embodiment of an oscillator frequency offset error estimator in accordance with the invention. As illustrated in FIG. 8, first register 1900 (or alternatively register 2000) is set to zero. This may be accomplished, for example, by loading two zeros into ALU 1400 using signal bus 2100 and MUXs 1600 and 1700. Next, assuming successive baseband signal samples are being stored in RAM 1100, the successive signal samples may be read from RAM 1100 via signal bus 2100 to CORDIC processor 1300 and "multiplied" to obtain an estimate of phase offset to accumulate in register 1900. The operation of a CORDIC processor to "multiply" a pair of complex signal samples and determine the angle between the two signal samples is well-known and will not be described here in detail. As illustrated in FIG. 7, a first baseband signal sample may be provided to CORDIC processor 1300 via MUX 2200 along a signal path in which this signal sample has been shifted in phase 90° by phase shifter 2300 and delayed by time delay 2400 at least until a second, next successive, signal sample is obtained. Block 2300 may comprise, for example, digital circuitry in which the sign of either orthogonal component of the signal sample, such as the inphase or quadrature components, may be reversed, depending upon the particular embodiment, to effect a 90° phase shift. Of course, instead of employing a separate time delay component, such as 2400, alternatively the successive signal samples may be stored in memory 1100 and then one signal sample may be passed to the CORDIC through the phase shifter. The signal samples may be designated with pointers "mem 1" and "mem 2," for example, as illustrated by the flowchart in FIG. 8.

CORDIC processor 1300 has now obtained two successive baseband signal samples, one of the signal samples being phase shifted and time delayed relative to the other signal sample. Therefore, the output signal produced by CORDIC processor 1300 comprises the phase difference between the two signal samples. As previously discussed, this phase difference may be employed to obtain an estimate of the oscillator frequency offset error. This estimate may then be provided to ALU 1400 via signal bus 2100 and MUX 1600. Thus, register 1900 may accumulate successive estimates of the oscillator frequency offset error. This is illustrated in the flowchart in FIG. 8 by a loop in which the memory pointers are incremented. Thus, the second signal sample of the previous phase comparison is phase adjusted and time delayed, as previously described, and compared in phase with the next successive signal sample, a third signal sample in this example. Likewise, as illustrated in FIG. 8, this process may be continued for all of the signal samples in the frequency burst or for a particular subset or "window" of the frequency burst signal samples. Once this process is complete, register 1900 contains an estimate of the accumulated oscillator frequency offset error, such as previously described in conjunction with FIG. 1. As illustrated in FIG. 8, this value may now be reported to a digital signal processor, or to another processor, so that the estimate may be adjusted, such as based on the number of signal samples, to provide an estimate of the oscillator frequency offset error, as previously described.

Figure 9:
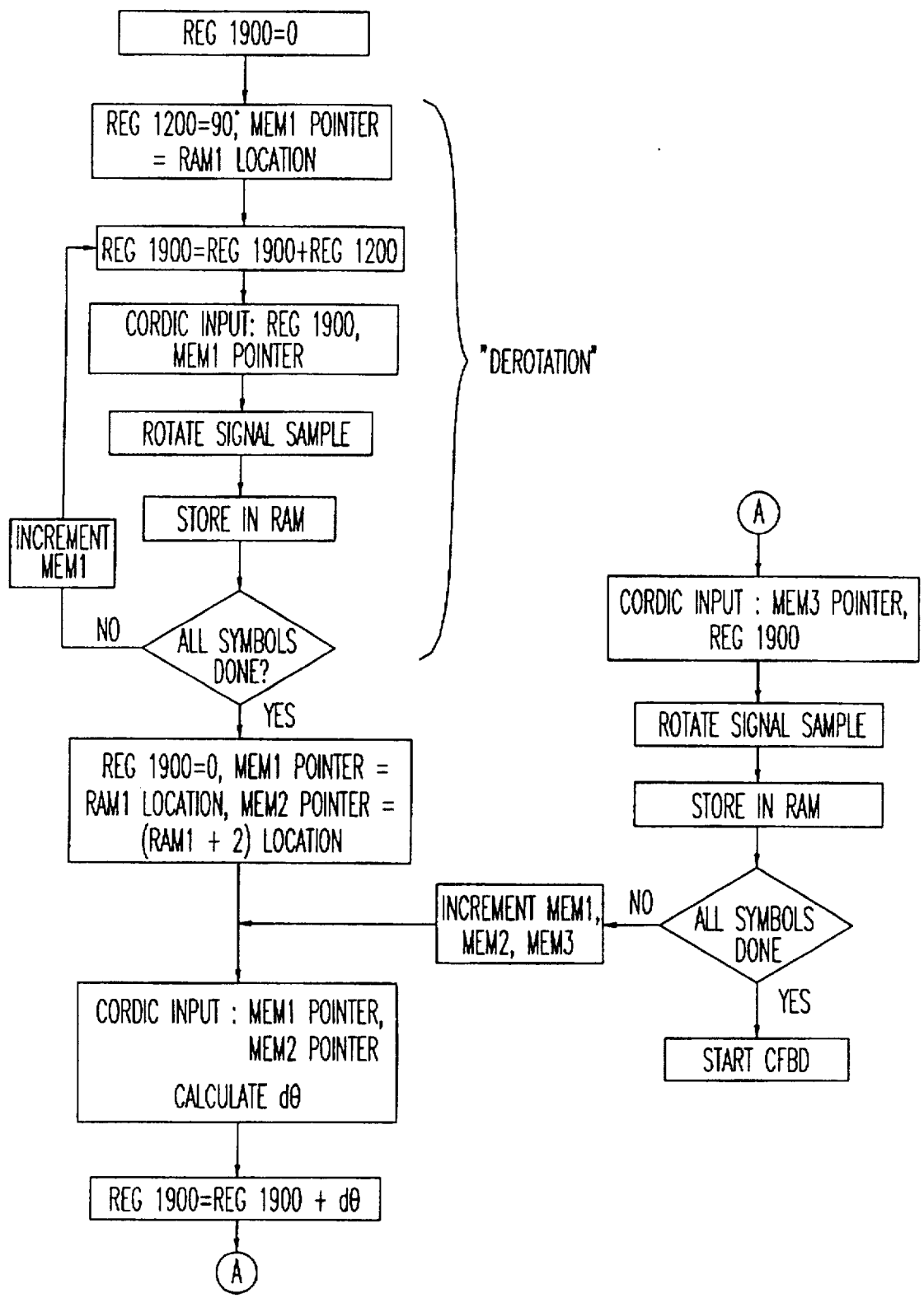

Vector co-processor 1000 illustrated in FIG. 7 may also be employed to implement an alternative embodiment of an oscillator frequency offset error estimator for a wireline communications system in accordance with the invention, such as the embodiment illustrated in FIG. 5. As illustrated in FIG. 9, this particular embodiment has a more complex flowchart than the one illustrated in FIG. 8, although as previously described, the embodiment has an advantage in that the processing includes the capability to adjust the signal samples in real time based on the estimated accumulated oscillator frequency offset error. As previously described, first register 1900 may be set to zero. Likewise, register 1200 may be loaded with 90° or ½ radians, depending upon the particular embodiment. Thus, first register 1900 accumulates the sum of zero and the angle stored in register 1200, in this particular embodiment 90°. The contents of register 1900 is then provided via signal bus 2100 to CORDIC processor 1300. Likewise, a first baseband signal sample, stored in the "mem 1" portion of RAM 1100, is provided to CORDIC processor 1300 and CORDIC processor 1300 "derotates" the signal sample based on the contents of register 1900. The result of this "derotation" is then stored in RAM 1100, such as in the "mem 3" portion, via signal bus 2100. Assuming all the baseband signal samples have not been processed, this sequence of operations is repeated by incrementing the "mem 1" pointer, although now the contents of register 1900 is provided via MUX 1700 to ALU 1400 while the contents of register 1200 is provided to ALU 1400 via MUX 1600. The result of this arithmetic operation is stored in register 1900 so that register 1900 contains the value of the angle to be applied to the next baseband signal sample obtained from memory 1100, such as 180° in this particular example. As before, the contents of register 1900 is provided to CORDIC processor 1300 to be applied to the next baseband signal sample, the baseband signal sample is "derotated," and the result is stored in RAM 1100. This process continues until all of the baseband signal samples or a particular subset have been derotated. Once this is complete, register 1900 is again loaded with a zero in order to initialize the register.

One memory pointer may, of course, be employed to provide two successive derotated baseband or decoded signal samples to CORDIC processor 1300. It is noted that this approach might have also been employed in the implementation previously described and illustrated in FIG. 8 assuming RAM 1100 contained the baseband signal samples, although the invention is not restricted in scope to these particular details. Once these successive signal samples have been provided to CORDIC processor 1300, the CORDIC processor may be employed to perform a differential phase calculation. As previously described, this aspect of CORDIC processor operation is well-known and will not be described here. It is noted that in comparison with the implementation associated with the flowchart illustrated in FIG. 8, a 90° phase shift of one of the signal samples relative to the other is not needed because derotation has already been performed. An estimate of the oscillator frequency offset error may then provided to ALU 1400 via signal bus 2100 and MUX 1600 so that it may be accumulated in register 1900. Likewise, after each oscillator frequency offset error has been estimated and then accumulated in register 1900, an estimate of the accumulated oscillator frequency offset error may then be applied to a derotated baseband signal sample indicated by another memory pointer, such as the "mem 3" pointer in FIG. 9, in order to compensate for any accumulated oscillator frequency offset error. This may be accomplished, for example, by providing the contents of register 1900 to CORDIC processor 1300, as previously described, and, likewise, providing the indicated derotated baseband signal sample to the CORDIC processor via signal bus 2100. Thus, CORDIC processor 1300 may further rotate the derotated baseband signal sample based on the estimate of the accumulated oscillator frequency offset error from register 1900 and the result may be stored in RAM 1100. Again, this process may continue until all of the signal samples or a particular subset have been adjusted or compensated. Thus, in this particular embodiment, the CORDIC is used twice to process every symbol; first, to perform the calculation to estimate the offset error and, second, to remove the estimate of the offset error from a signal sample. Depending upon the particular embodiment, the compensated or adjusted derotated baseband signal samples may also now be employed to confirm the presence of the frequency burst, as indicated below.

It will now be appreciated that an oscillator frequency offset error estimator for a wireline communications system in accordance with the invention may be employed independently of a coarse frequency burst detector, such as described in concurrently filed patent application Ser. No. 08/357,804. However, in such a situation, another technique for identifying the presence of a frequency burst may be employed so that an oscillator frequency offset error estimator in accordance with the invention may be applied to the frequency burst signal to perform estimation and/or correction after the presence of the frequency burst is identified. Likewise, an oscillator frequency offset error estimator in accordance with the invention may also be used effectively in conjunction with a coarse frequency burst detector, such as described in concurrently filed patent application Ser. No. 08/357,804. Nonetheless, for such a system, a number of different embodiments may provide satisfactory performance. For example, as described in concurrently filed patent application Ser. No. 08/357,804, a coarse frequency burst detector may be employed with a relatively small "window" of signal samples in order to detect the presence of a frequency burst, especially for relatively high offset errors. Once a frequency burst is detected employing this relatively small window, as described in concurrently filed patent application Ser. No. 08/357,804, then an oscillator frequency offset error estimator in accordance with the invention may be employed to further obtain an estimate of the oscillator frequency offset error. Once the frequency offset error is obtained, it may be used to remove the oscillator frequency offset error from subsequent frequency bursts. Likewise, once the frequency burst is corrected, a relatively larger window may be employed, such as in a CFBD as described in concurrently filed patent application Ser. No. 08/357,804, to reconfirm the presence of the frequency burst and to reduce the false detection rate.

Likewise, as previously described, a number of different embodiments of an oscillator frequency offset error estimator in accordance with the invention may provide satisfactory operation. Advantages associated with the alternative embodiments may be considered in making a determination regarding the particular approach to employ. For example, as just described, it may be desirable, after obtaining an estimate of the oscillator frequency offset error, to employ a technique in which the presence of the frequency burst is confirmed by a coarse frequency burst detector for a wireline communications system, as described in concurrently filed patent application Ser. No. 08/357,804, using signal samples adjusted or compensated for the oscillator frequency offset error. If such an approach is employed, then it may be desirable to employ the embodiment illustrated in FIG. 5 because the signal samples are adjusted or corrected in real-time. Nonetheless, as indicated previously, the embodiment illustrated in FIG. 1 may also be employed to provide satisfactory performance in this situation. Likewise, it may not be necessary or even desirable in some circumstances to confirm the presence of a frequency burst in this manner. Furthermore, if the embodiment of an oscillator frequency offset error estimator in accordance with the invention illustrated in FIG. 1 is employed, then as described in concurrently filed patent application Ser. No. 08/357,804, the estimate of the oscillator frequency offset error obtained may be provided to an embodiment of a coarse frequency burst detector so that automatic frequency correction (AFC) may be performed by the coarse frequency burst detector rather than by the oscillator frequency offset error estimator. Various considerations may affect the selection of the appropriate alternative embodiment of an oscillator frequency offset error estimator in accordance with the invention to employ. The scope of the invention is therefore not limited to any particular embodiment described.

A method of comparing signal samples to estimate the oscillator frequency offset error for an oscillator at the receiving end of a wireline communications system may be accomplished in the following manner. As previously described, signal samples, such as baseband signal samples, may be derived from a baseband signal transmitted via the wireline communications system. A signal sample processed by an oscillator at the receiving end of the wireline communications system may be delayed at least until the next successive signal sample processed by the oscillator is also obtained. The phase of at least one of the two signal samples may then be adjusted. As previously described, typically the baseband signal samples are obtained from the baseband signal using a baseband CODEC. Thus, as illustrated in FIG. 7, a CORDIC processor may be employed to implement the phase adjustment. Likewise, the signal sample may be adjusted in phase first and then delayed, depending upon the particular embodiment. However, after the phase adjustment step, the phase of the two signal samples are compared. Likewise, either of the two signal samples may be adjusted in phase; however, if the delayed signal sample is adjusted then the phase of the delayed signal sample is shifted by 90°, whereas if the next successive, or non-delayed, signal sample is adjusted in phase, then the phase of that signal sample is shifted by −90° in this particular embodiment. Furthermore, an estimate of the oscillator frequency offset error obtained by comparing the phase of the two signal samples may be produced a number of ways. For example, an estimate of the oscillator frequency offset error may be produced in accordance with a phase offset obtained from the phase comparison. Likewise, these successive estimates may be accumulated or integrated. Alternatively, comparing the signal samples in phase may comprise comparing the offset for separate orthogonal components of the two signal samples, such as the inphase and quadrature components in this embodiment. Successive offsets for the inphase and quadrature components may be averaged to thereby produce an estimate of the oscillator frequency offset error from the averaged components. Likewise, prior to the steps of delaying and comparing, successive signal samples may be derotated, as previously described. Thus, the step of delaying may comprise delaying a derotated signal sample and the step of comparing the phase may comprise comparing the phase of the two derotated signal samples. Likewise, as previously described, the oscillator frequency offset error or accumulated oscillator frequency offset error estimate may be employed, either in real-time or after processing all the signal samples, to adjust the phase of the signal samples so that any oscillator frequency offset error or accumulated oscillator frequency offset error is either reduced or possibly even eliminated.

While only certain features of the invention have been illustrated and described herein, many modifications, substitutions, changes or equivalents may now occur to those skilled in the art. It is, therefore, to be understood that the appended claims are intended to cover all such modifications and changes as fall within the true spirit of the invention.

I claim:

1. An integrated circuit for a receiving station of a communications system having an oscillator frequency offset error estimator that inputs a predetermined frequency burst of binary symbols, the oscillator frequency offset error estimator comprising:
    a phase shifter that adjusts a phase of at least one of two sets of successive predetermined frequency burst of binary symbols;
    a phase comparator comparing the two sets of successive predetermined frequency burst of binary symbols to generate a plurality of frequency burst phase offsets, one of said two sets of successive predetermined frequency burst of binary symbols being provided to said phase comparator along a signal path through the phase shifter and a time delay; and
    an accumulator coupled to said phase comparator that accumulates said plurality of frequency burst phase offsets generated by said phase comparator to generate an oscillator frequency error offset.

2. The integrated circuit of claim 1, wherein said phase comparator comprises means for comparing phases of the two sets of successive predetermined frequency burst of binary symbols to generate the frequency burst phase offsets.

3. The integrated circuit of claim 2, wherein said means for comparing the phases of the two sets of successive predetermined frequency burst of binary symbols comprises a coordinate rotation digital computer (CORDIC) processor.

4. The integrated circuit of claim 1, wherein the phase shifter is a signal processor for derotating one of the two sets of successive frequency burst of binary symbols before said phase comparator compares the two sets of successive frequency burst of binary symbols.

5. The integrated circuit of claim 4, wherein said phase comparator comprises means for phase comparing said two sets of successive predetermined frequency burst of binary symbols and said signal processor comprises means for derotating binary symbols.

6. The integrated circuit of claim 1, wherein said phase comparator comprises phase comparing means for phase comparing said two sets of successive predetermined frequency burst of binary symbols to generate the frequency burst phase offsets and said accumulator comprises means for accumulating the frequency burst phase offsets generated by said phase comparing means.

7. The integrated circuit of claim 1, wherein the accumulator accumulates the plurality of frequency burst phase offsets by separately accumulating orthogonal components of the plurality of frequency burst phase offsets.

8. The integrated circuit of claim 1, wherein the predetermined frequency burst of binary symbols is a set of successive zeros or ones.

9. A method for estimating an oscillator frequency offset error for an oscillator using a predetermined frequency burst of binary symbols in a receiving station of a communications system, said method comprising the steps of:
    delaying at least one of two sets of successive predetermined frequency burst of binary symbols;
    adjusting a phase of the at least one of the two sets of successive predetermined frequency burst of binary symbols;
    comparing the two sets of successive predetermined frequency burst of binary symbols to generate a plurality of frequency burst phase offsets; and
    accumulating said plurality of frequency burst phase offsets generated by said phase comparator to generate the oscillator frequency offset error.

10. The method of claim 9, wherein the adjusting step adjusts a phase of the at least one of the two sets of successive predetermined frequency burst of binary symbols by 90°.

11. The method of claim 9, wherein the comparing step separately generates orthogonal components of the plurality of frequency burst phase offsets.

12. The method of claim 11, wherein the orthogonal components comprises inphase and quadrature components.

13. The method of claim 12, further comprising averaging the inphase and quadrature components of the accumulated plurality of frequency burst phase offsets to generate an oscillator frequency error estimate.

14. The method of claim 9, wherein the adjusting step derotates the at least one of the two sets of successive predetermined frequency burst of binary symbols, the delaying step delays one of the two sets of successive predetermined frequency burst of binary symbols, and the comparing step compares phases of the two sets of successive frequency burst of binary symbols.

15. The method of claim 14, further comprising:
    generating an estimate of the oscillator frequency offset error based on the accumulated plurality of frequency burst phase offsets, the estimate being used to adjust a phase of received binary symbols.

16. The method of claim 9, wherein the predetermined frequency burst of binary symbols is a set of successive zeros or ones.

17. An integrated circuit for a receiving station of a communications system having an oscillator frequency offset error estimator that inputs a predetermined frequency burst of binary symbols, the oscillator frequency offset error estimator comprising:
    a signal processor that receives and derotates a set of successive predetermined frequency burst of binary symbols to generate a first set of successive predetermined frequency burst of binary symbols;
    a phase comparator coupled to the signal processor that compares the first set of successive predetermined frequency burst of binary symbols and a second set of successive predetermined frequency burst of binary symbols of to generate a plurality of frequency burst phase offsets, one of said first and said second sets of successive predetermined frequency burst of binary symbols provided along a signal path through a time delay; and an accumulator coupled to said phase comparator that accumulates said plurality of frequency burst phase offsets generated by said phase comparator to generate an oscillator frequency error offset.

18. The integrated circuit of claim 17, wherein the predetermined frequency burst of binary symbols is a set of successive zeros or ones.

19. A method for estimating an oscillator frequency offset error for an oscillator using a predetermined frequency burst of binary symbols in a receiving station of a communications system, said method comprising the steps of:

derotating successive predetermined frequency burst of binary symbols to generate a first set of successive predetermined frequency burst of binary symbols and a second set of successive predetermined frequency burst of binary symbols;

delaying one of the first and the second sets of successive predetermined frequency burst of binary symbols; then comparing a phase of the derotated first and second sets of successive predetermined frequency burst of binary symbols to generate a plurality of frequency burst phase offsets; and accumulating said plurality of frequency burst phase offsets to generate the oscillator frequency offset error.

20. The method of claim 19, wherein the predetermined frequency burst of binary symbols is a set of successive zeros or ones.

* * * * *